(12) United States Patent
Lee et al.

(10) Patent No.: US 12,359,305 B2
(45) Date of Patent: Jul. 15, 2025

(54) DEPOSITION DEVICE HAVING CONTACT STRUCTURE AND DEPOSITION SYSTEM HAVING SAME

(71) Applicants: JOINSOLUTION CO., LTD., Hwaseong-si (KR); Sang Bin Lee, Seoul (KR)

(72) Inventors: Sang Bin Lee, Seoul (KR); Min Ho Kim, Hwaseong-si (KR)

(73) Assignees: JOINSOLUTION CO., LTD. (KR); Sang Bin Lee (KR)

( * ) Notice: Subject to any disclaimer, the term of this patent is extended or adjusted under 35 U.S.C. 154(b) by 592 days.

(21) Appl. No.: 17/853,911

(22) Filed: Jun. 29, 2022

(65) Prior Publication Data

US 2023/0340659 A1 Oct. 26, 2023

(30) Foreign Application Priority Data

Apr. 20, 2022 (KR) .................. 10-2022-0048861
Apr. 29, 2022 (KR) .................. 10-2022-0053747

(51) Int. Cl.
*C23C 14/35* (2006.01)
*C23C 14/04* (2006.01)
*C23C 14/50* (2006.01)

(52) U.S. Cl.
CPC .......... *C23C 14/351* (2013.01); *C23C 14/042* (2013.01); *C23C 14/50* (2013.01)

(58) Field of Classification Search
None
See application file for complete search history.

(56) References Cited

U.S. PATENT DOCUMENTS

2016/0105971 A1* 4/2016 Han .................. B05B 12/20
    427/547
2018/0087143 A1* 3/2018 Moon .................... C23C 14/24

FOREIGN PATENT DOCUMENTS

| JP | 2002075639 A | 3/2002 |
|---|---|---|
| JP | 2020084329 A | 6/2020 |
| KR | 20120140079 A | 12/2012 |
| KR | 20220026754 A | 3/2022 |

\* cited by examiner

*Primary Examiner* — Jason Berman
(74) *Attorney, Agent, or Firm* — Renaissance IP Law Group LLP

(57) ABSTRACT

The present inventive concept relates to a deposition system including: a deposition device having a chamber, a seating plate located inside the chamber to seat a wafer, a magnet coupled to the underside of the seating plate, and a mask assembly located inside the chamber; and a transfer device having a load lock chamber for accommodating the wafer, an arm member for transferring the wafer from the load lock chamber to the seating plate, and a fourth driving module for moving the arm member, wherein the deposition device includes a first driving module for moving the magnet and the seating plate, a second driving module coupled to the first driving module to move the magnet, a third driving module for moving the wafer, and a control module for controlling the first driving module, the second driving module, the third driving module, and the fourth driving module.

19 Claims, 12 Drawing Sheets

DEPOSITION DEVICE HAVING CONTACT STRUCTURE AND DEPOSITION SYSTEM HAVING SAME

CROSS REFERENCE TO RELATED APPLICATION

The present application claims the benefit of Korean Patent Application No. 10-2022-0048861 and 10-2022-0053747 filed in the Korean Intellectual Property Office on 20 Apr. 2022 and 29 Apr. 2022, the entire contents of which are incorporated herein by reference.

FIELD

The present inventive concept relates to a deposition device having a contact structure and a deposition system having the same.

BACKGROUND OF THE RELATED ART

A Fine Metal Mask (FMM) is the mask on which micro patterns are formed, as a part related to the resolution of an Organic Light Emitting Diode (OLED) panel. Generally, the mask is a metallic plate that is made by punching about 20 million or more holes (patterns) on a thin metallic film with a thickness of 25 µm. As the resolution of the OLED panel is increased, therefore, a mask has to have finer patterns (a larger number of holes) and a thinner film (in the range of 8 to 15 µm).

A deposition device evaporates organic/metal materials by means of sputtering or heating to form a thin film on the surface of a wafer. In specific, the evaporated organic/metal materials pass through the patterns of the mask and are then deposited on the wafer.

As the patterned mask has a thinner thickness and its patterns become finer, the contact force between the wafer and the patterned mask may be reduced if the same deposition process as in conventional practices is carried out, which causes a high failure rate in the deposition process.

SUMMARY

Accordingly, the present inventive concept has been made in view of the above-mentioned problems occurring in the related art, and it is an object of the present inventive concept to provide a deposition device that is capable of having a contact structure configured to improve the contact force between a wafer and a mask so that the improved contact force is applied to the entire region of the mask.

It is another object of the present inventive concept to provide a deposition system that is capable of having a transfer device operating cooperatively with a contact structure of a deposition device, thereby automatically loading and unloading a wafer on and from the deposition device through the transfer device.

To accomplish the above-mentioned objects, according to an aspect of the present inventive concept, there is provided a deposition system including: a deposition device having a chamber, a seating plate located inside the chamber to seat a wafer, a magnet coupled to the underside of the seating plate, and a mask assembly located inside the chamber to allow at least a portion thereof to face the wafer; and a transfer device having a load lock chamber for accommodating the wafer, an arm member for transferring the wafer from the load lock chamber to the seating plate, and a fourth driving module for moving the arm member, wherein the deposition device comprises a first driving module for moving the magnet and the seating plate, a second driving module coupled to the first driving module to move the magnet, a third driving module for moving the wafer, and a control module for controlling the first driving module, the second driving module, the third driving module, and the fourth driving module, the control module being configured to perform a wafer loading process before a deposition process and a wafer unloading process after the deposition process.

To accomplish the above-mentioned objects, according to another aspect of the present inventive concept, there is provided a deposition device including: a chamber; a mask assembly located inside the chamber and having a mask region made of a metal material and having micro patterns and a frame region formed around the mask region; a seating plate located inside the chamber and having a first surface on which a wafer is seated and a second surface opposite to the first surface, at least a portion of the wafer being disposed to face the mask assembly; a magnet structure located on the second surface of the seating plate inside the chamber and having a magnet and a magnet holder for accommodating at least a portion of the magnet; a first driving module for moving the magnet structure and the seating plate together in a first direction; a second driving module for moving the magnet structure in the first direction; and a control module for controlling the first driving module and/or the second driving module to adjust a distance between the magnet and the mask region.

BRIEF DESCRIPTION OF THE DRAWINGS

The above and other objects, features and advantages of the present inventive concept will be apparent from the following detailed description of the embodiments of the invention in conjunction with the accompanying drawings, in which.

DETAILED DESCRIPTION OF THE EMBODIMENTS

Figure 1:
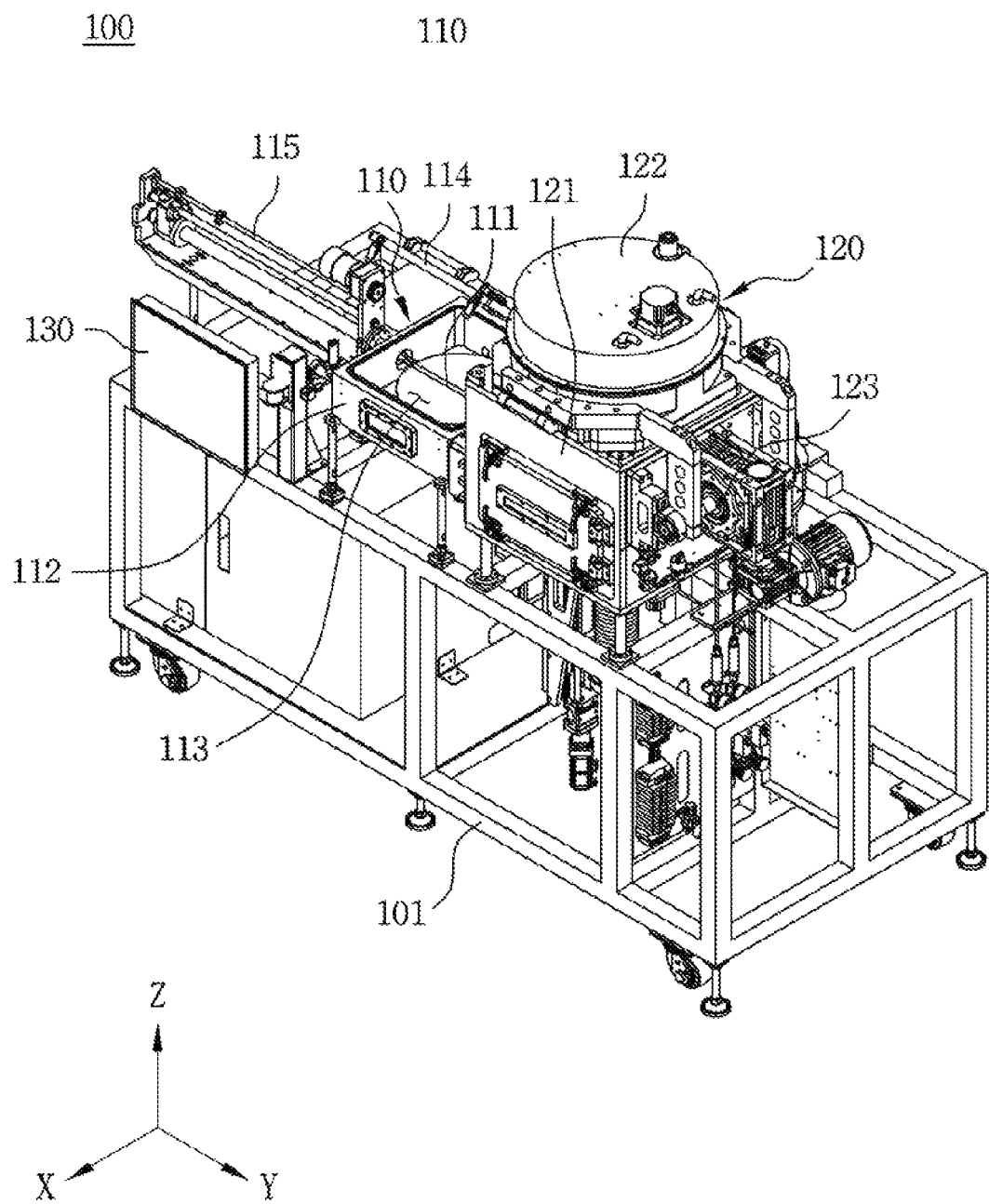
FIG. 1 is a perspective view showing a deposition system according to the present inventive concept.

Hereinafter, the present inventive concept will be explained in detail with reference to the attached drawings. Specific exemplary embodiments of the present inventive concept are illustrated in the drawings and described in detail in the detailed description. However, this does not limit the invention within specific embodiments and it should be understood that the invention covers all the modifications, equivalents, and replacements within the idea and technical scope of the invention. In the drawings, the corresponding parts in the embodiments of the present inventive concept are indicated by corresponding reference numerals.

Figure 2:
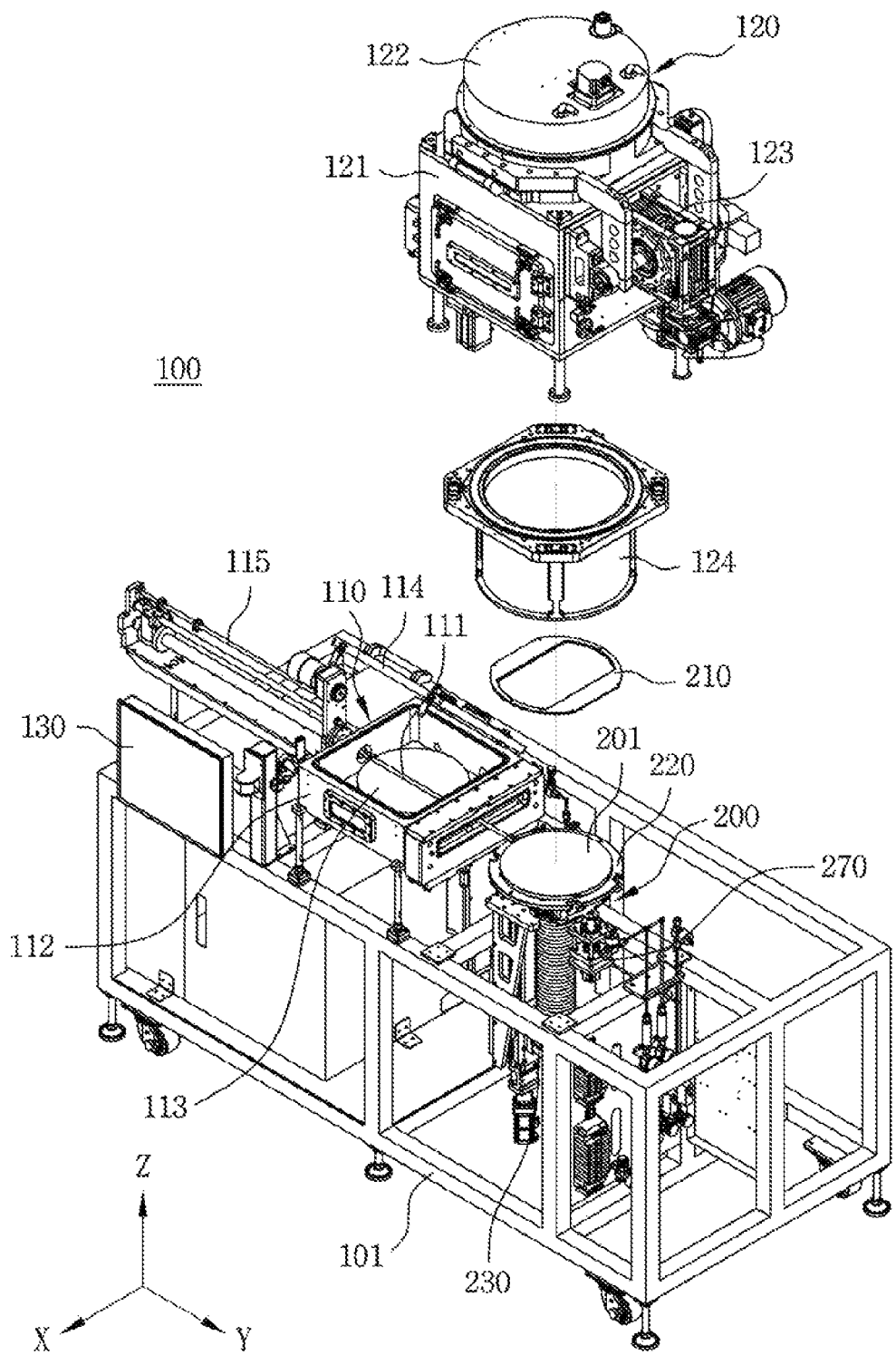
FIG. 2 is an exploded perspective view showing the deposition system according to the present inventive concept.

FIG. 1 is a perspective view showing a deposition system according to the present inventive concept, and FIG. 2 is an exploded perspective view showing the deposition system according to the present inventive concept.

As shown in FIGS. 1 and 2, a deposition system 100 is configured to deposit deposition materials on a wafer 201. For example, the wafer 201 may include glass. The deposition materials may include organic materials, metals, or a compound thereof. For example, the deposition system 100 is used in at least some of organic light emitting diode (OLED) manufacturing process or micro LED manufacturing process.

Referring to FIGS. 1 and 2, the deposition system 100 includes a main frame 101, a deposition device 120, a transfer device 110, a display module 130, a control module, and a contact structure 200. The main frame 101 is configured to locate the deposition device 120, the transfer device 110, the display module 130, the control module, and the contact structure 200 therein. For example, the transfer device 110 and the deposition device 120 are located in a horizontal direction (for example, in a Y-axis direction) inside the main frame 101. For example, the transfer device 110 includes a load lock chamber 112 for accommodating the wafer 201, an arm member 111 for moving the wafer 201 located in the load lock chamber 112 to the inside of the deposition device 120, and a fourth driving module 115. According to other embodiments of the present inventive concept, the transfer device 110 includes a first cover 114 openably and closably coupled to the load lock chamber 112.

According to one embodiment of the present inventive concept, the arm member 111 of the transfer device 110 extends above the surface of a seating plate 220 of the contact structure 200 from an internal space 113 of the load lock chamber 112. For example, the arm member 111 moves horizontally by means of a third driving module as will be discussed later. For example, the wafer 201 is located on the end of the arm member 111. As the arm member 111 moves from the internal space 113 of the load lock chamber 112 to the seating plate 220 of the contact structure 200, the wafer 201 moves to the seating plate 220 of the contact structure 200. In a wafer transfer process, a portion of the arm plate 111 is located on the seating plate 220 or the inside (for example, a chamber 121) of the deposition device 120.

According to one embodiment of the present inventive concept, the deposition device 120 is connected to the transfer device 110 to perform a deposition process for depositing the deposition materials on the wafer 201 moving by means of the transfer device 110. For example, the deposition device 120 and the transfer device 110 are connected to each other to allow the wafer 201 to be movable. The deposition device 120 includes the chamber 121 where the deposition process is performed, and a target (for example, the wafer 121) to which the deposition materials are applied by means of sputtering is located inside the chamber 121. The chamber 121 is a vacuum chamber. Further, a support structure 124 is disposed inside the chamber 121 to support a mask assembly 210. According to other embodiments of the present inventive concept, the deposition device 120 includes a second cover 122 for opening and closing the chamber 121 and an opening and closing module 123 for operating the second cover 122.

As shown, the support structure 124 has the shape of a cylinder whose both sides in a Z-axis direction are open, but while being not limited thereto, it may have various shapes capable of supporting the mask assembly 210 in a gravity direction (for example, in the Z-axis direction). According to one embodiment of the present inventive concept, at least a portion of the mask assembly 210 is laid on the wafer 201 and a magnet structure 250 as will be discussed later in the Z-axis direction. When viewed in the Z-axis direction, in specific, the mask assembly 210 is located on the uppermost position, the wafer 201 on the underside of the mask assembly 210, and the magnet structure 250 on the underside of the wafer 201.

According to one embodiment of the present inventive concept, at least a portion of the contact structure 200 is located inside the deposition device 120. For example, the contact structure 200 includes the seating plate 220 on which the wafer 201 is seated, the magnet structure 250 located under the seating plate 220, and the mask assembly 210 located on top of the seating plate 220.

According to one embodiment of the present inventive concept, the contact structure 200 includes a magnet 251 and first and second driving modules 230 and 240 for adjusting the position of the wafer 201. For example, the first driving module 230 is configured to move the magnet structure 250 and the seating plate 220 together, and the second driving module 240 is configured to move only the magnet structure 250.

According to one embodiment of the present inventive concept, the contact structure 200 further includes a third driving module 270 for moving the wafer 201. The third driving module 270 is operable cooperatively with the arm member 111 of the transfer device 110. For example, the arm member 111 moves in an X-axis direction in a state of supporting the underside of the wafer 201 and thus enters the inside of the deposition device 120. After that, the third driving module 270 moves in the Z-axis direction to separate the wafer 201 from the arm member 111. Next, the arm member 111 released from the contact with the wafer 201 moves again in the Y-axis direction, and the third driving module 270 moves the wafer 201 in the Z-axis direction to allow the wafer 201 to be seated on the seating plate 220.

According to the embodiment of the present inventive concept, the seating plate 220 and the mask assembly 210 are located inside the deposition device 120, and given portions of the first to third driving modules 230, 240, and 270 are located inside the deposition device 120.

According to one embodiment of the present inventive concept, the control module is configured to control at least one of the deposition device 120, the transfer device 110, the first driving module 230, the second driving module 240, and the third driving module 270. For example, the control module operates a vacuum pump for forming a vacuum in the chamber 121 of the deposition device 120, the arm member 111 of the transfer device 110 to move the wafer 201, or the first driving module 230, the second driving module 240, and the third driving module 270 of the contact structure 200.

Figure 3:
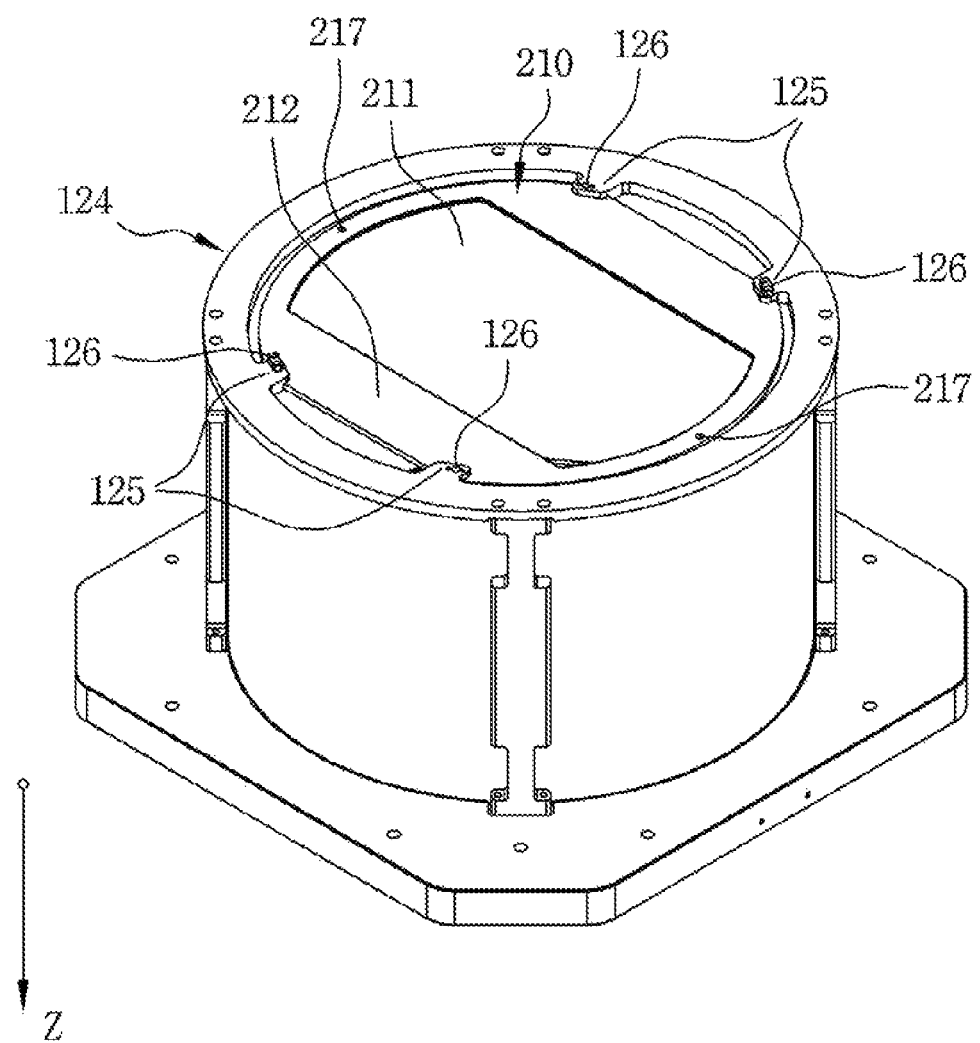
FIG. 3 is a perspective view showing a mask assembly and a support structure of a deposition device according to the present inventive concept.

FIG. 3 is a perspective view showing the mask assembly and the support structure of the deposition device according to the present inventive concept.

Referring to FIG. 3, the mask assembly 210 is supported against the support structure 124. The support structure 124 is located inside the chamber 121 of the deposition device 120, together with the mask assembly 210. The support structure 124 whose both sides in the Z-axis direction are open is provided, and the mask assembly 210 is supported in a −Z-axis direction by means of flanges 125 formed on the periphery of the open portion in the −Z-axis direction of the support structure 124.

Figure 9:
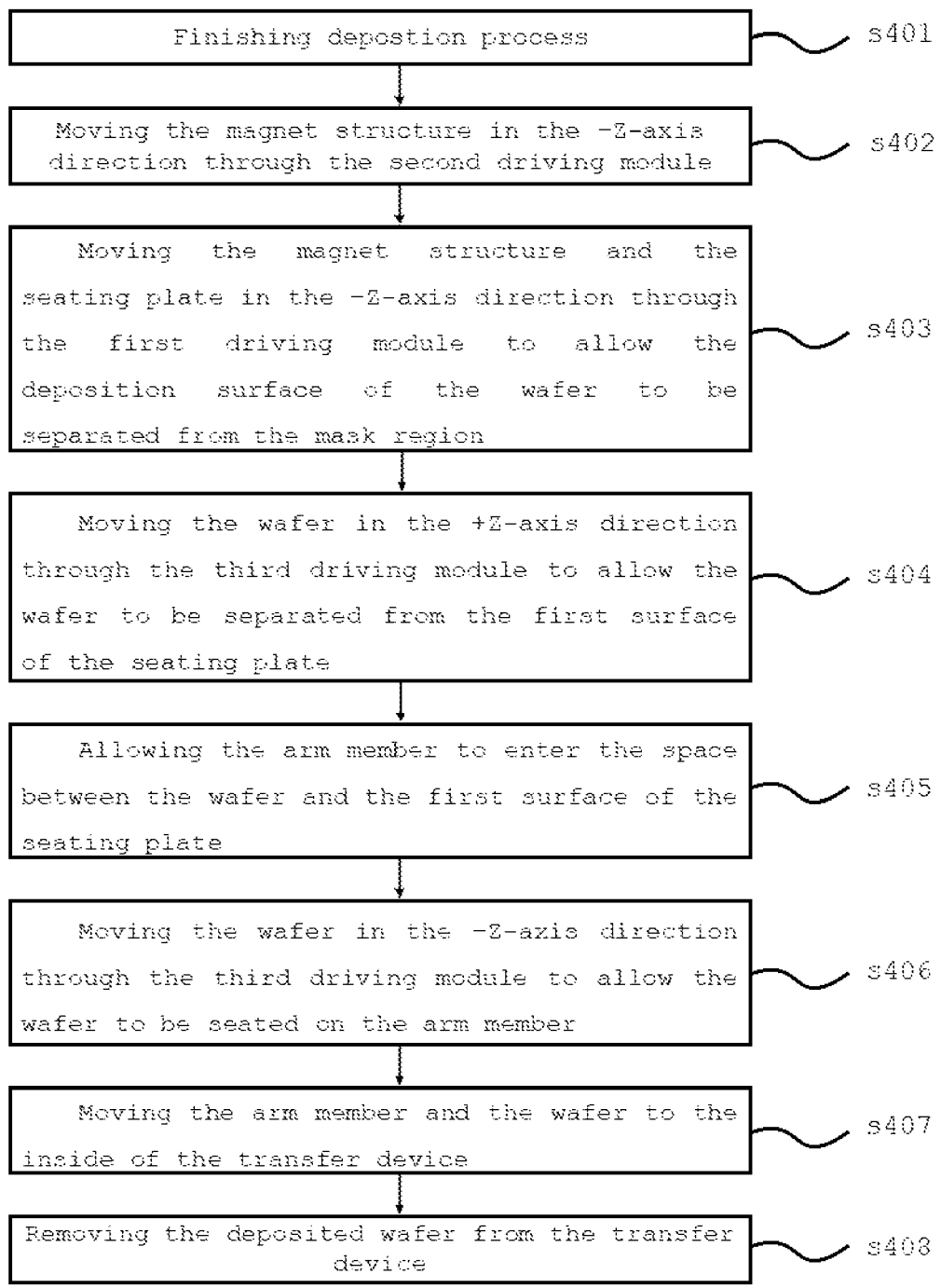
FIG. 9 is a flowchart showing some of a wafer unloading process of the deposition device according to the present inventive concept.
Figure 10A:
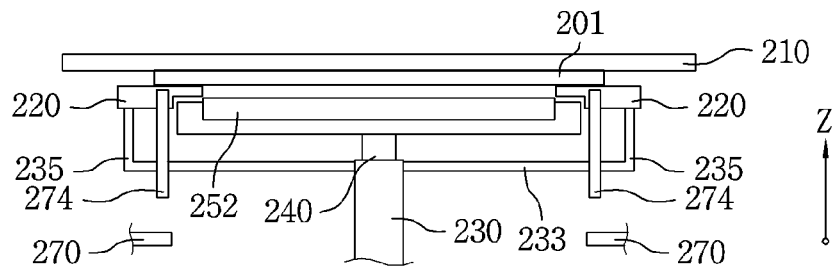
FIGS. 10A to 10E are sectional views showing the deposition device in the wafer unloading process of FIG. 9.
Figure 10B:
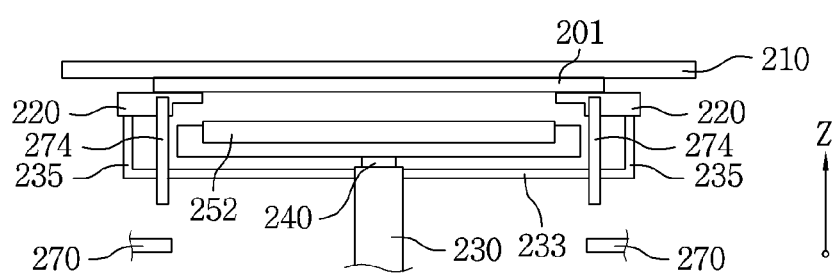
Figure 10C:
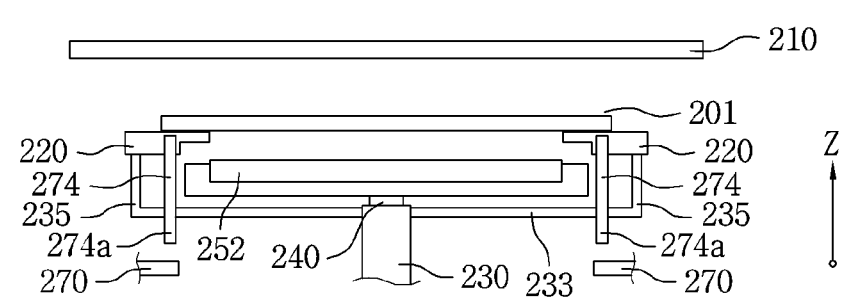
Figure 10D:
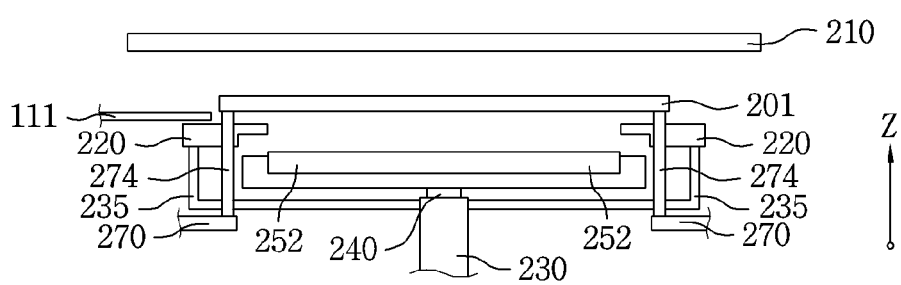
Figure 10E:
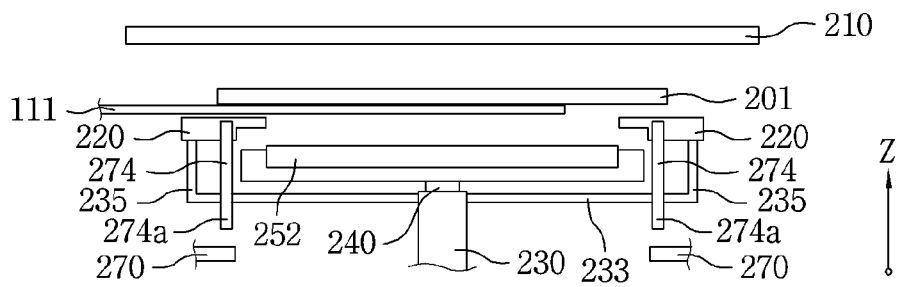

Referring to FIG. 3 together with FIG. 9, according to one embodiment of the present inventive concept, the mask assembly 210 includes a mask region 211 having micro patterns and a frame region 212 formed around the mask region 211. For example, the frame region 212 is supported against the flanges 125.

Figure 7:
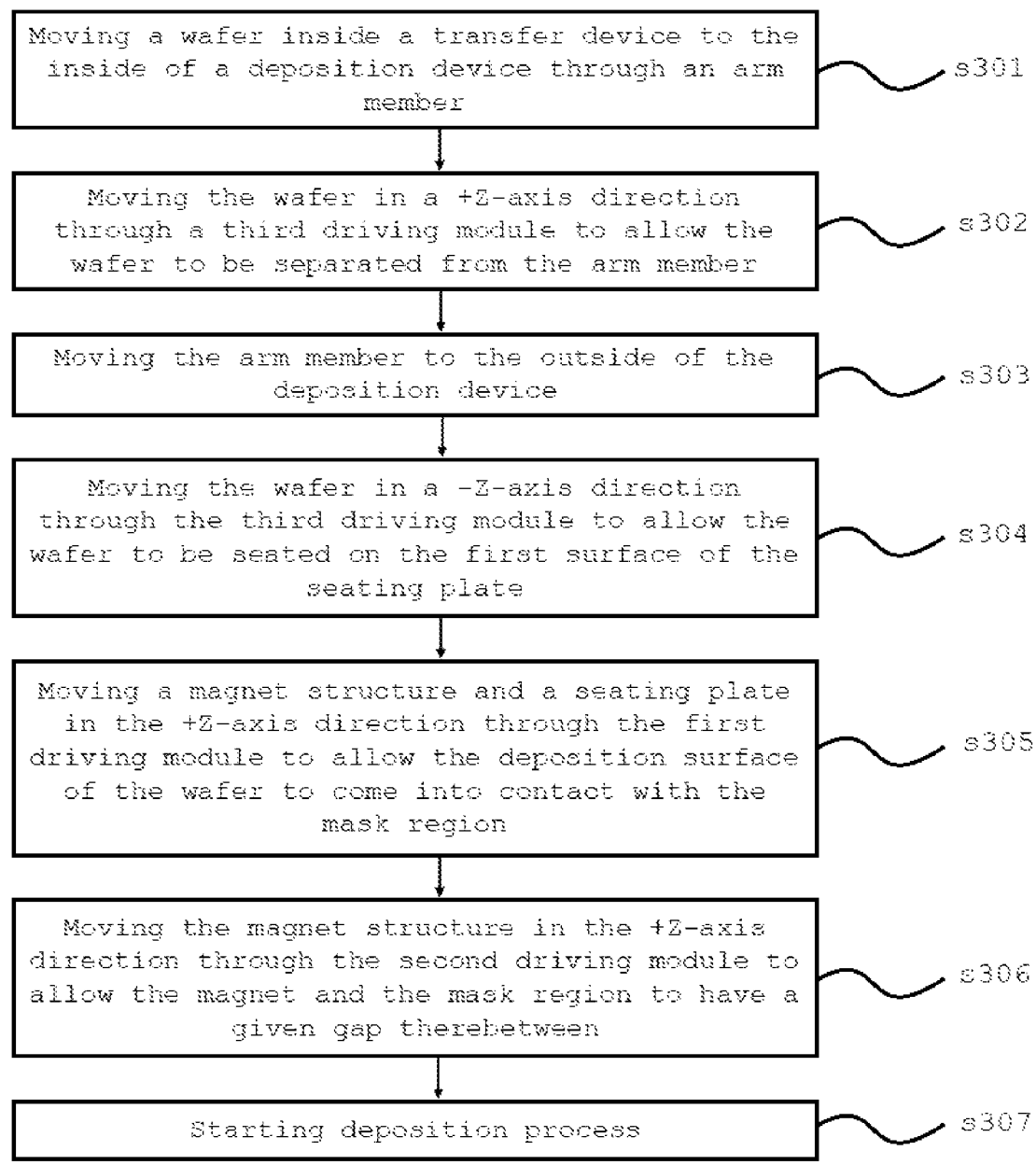
FIG. 7 is a flowchart showing some of a wafer loading process of the deposition device according to the present inventive concept.
Figure 8A:
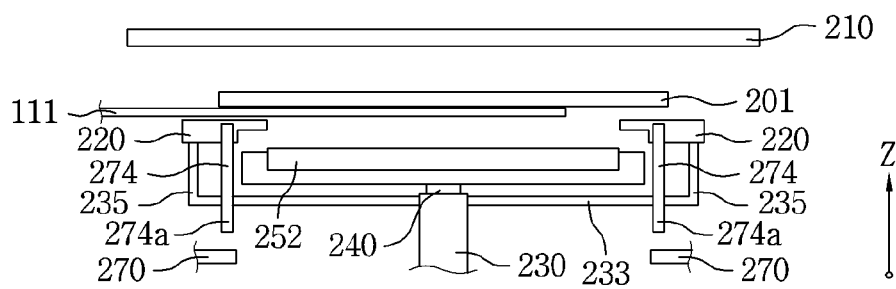
FIGS. 8A to 8E are sectional views showing the deposition device in the wafer loading process of FIG. 7.
Figure 8B:
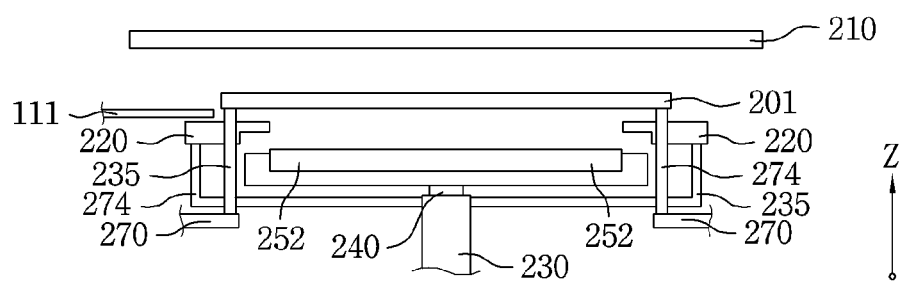
Figure 8C:
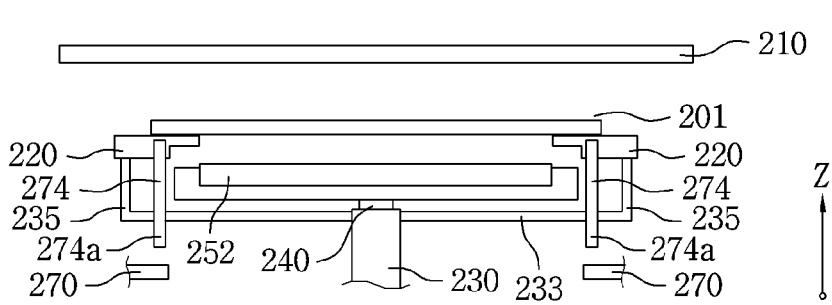
Figure 8D:
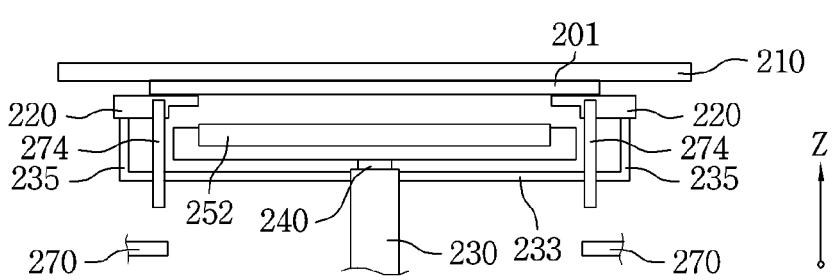
Figure 8E:
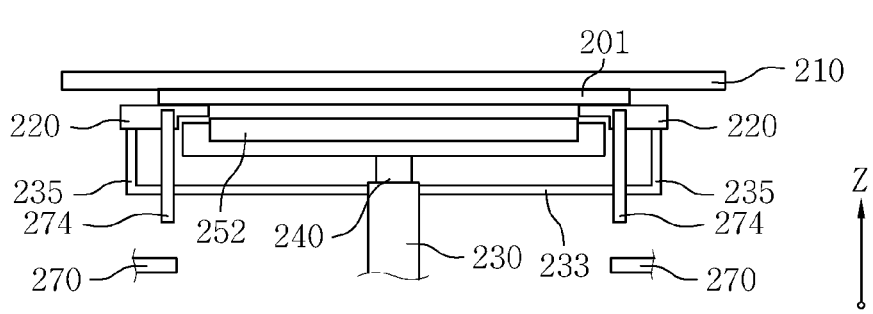

Referring to FIG. 3 together with FIGS. 7 and 8, according to one embodiment of the present inventive concept, the mask assembly 210 moves in the Z-axis direction by means of the first driving module 230. For example, the first driving module 230 moves the magnet structure 250 and the seating plate 220 in a +Z-axis direction, and the deposition surface (for example, top) of the wafer 201 seated onto the seating plate 220 comes into contact with the mask region 211 of the mask assembly 210. In this case, the first driving module 230 moves further to the +Z-axis direction in the state where the wafer 201 comes into contact with the mask region 211 of the mask assembly 210.

Figure 4:
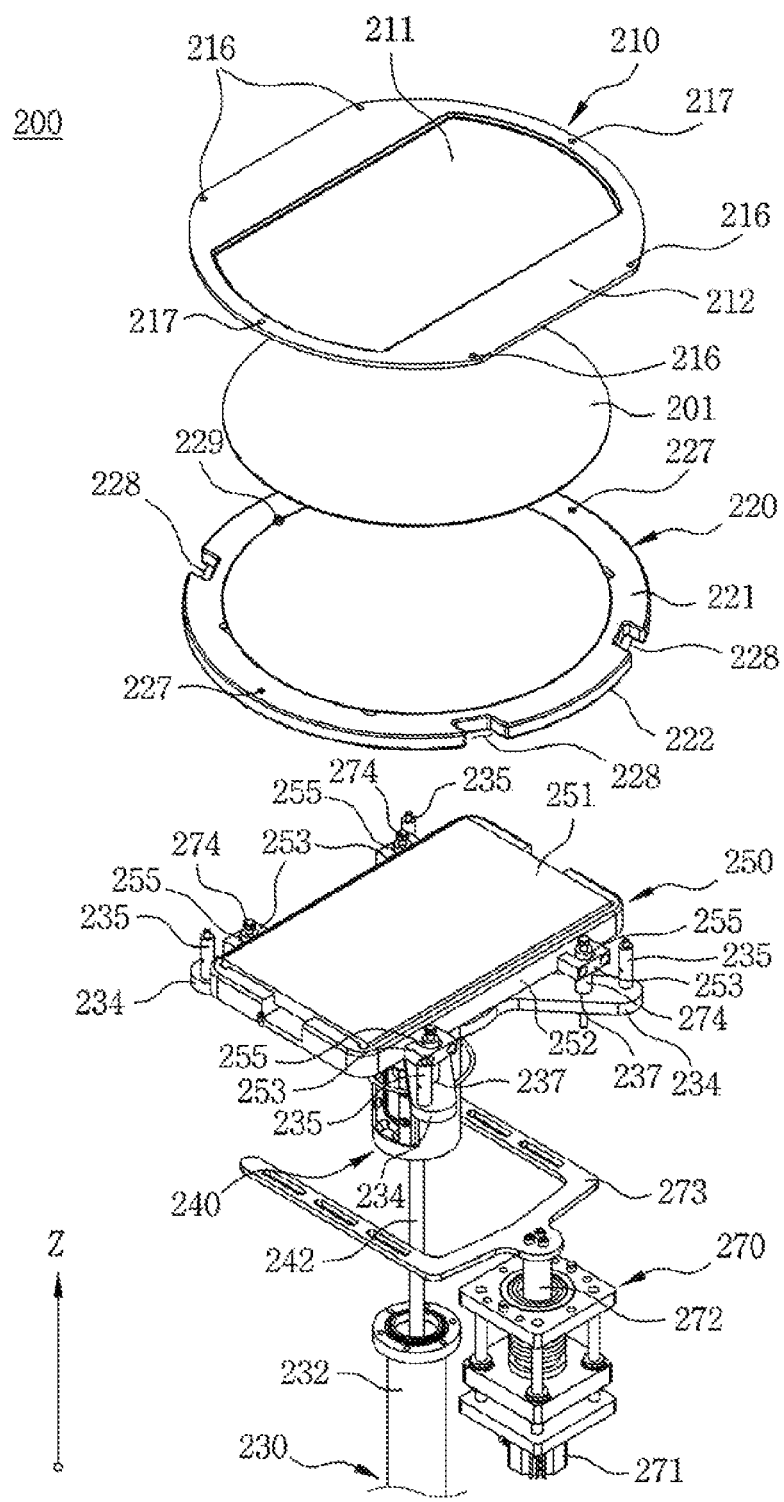
FIG. 4 is an exploded perspective view showing a contact structure of the deposition device according to the present inventive concept.

Referring to FIGS. 3 and 4, first protrusions 126 protrude from the flanges 125 of the support structure 124. The first protrusions 126 protrude in the +Z-axis direction. For example, at least portions of the first protrusions 126 are inserted into first holes 216 formed on the mask assembly 210. The first protrusions 126 are formed on the positions aligned in the Z-axis direction with the first holes 216 of the mask assembly 210. The first protrusions 126 and the first holes 216 serve to align the mask assembly 210 and the support structure 124 with each other.

According to one embodiment of the present inventive concept, if the seating plate 220 moves in the +Z-axis direction by means of the first driving module 230 to pressurize the mask assembly 210 in the +Z-axis direction, the mask assembly 210 is separated from the flanges 125 to allow the first protrusions 126 on the flanges 125 to escape from the first holes 216.

Referring to FIGS. 3 and 4, the mask assembly 210 has second holes 217 formed thereon, and the seating plate 220 has second protrusions 227 formed thereon so that at least portions of the second protrusions 227 are inserted into the second holes 217. The second holes 217 and the second protrusions 227 serve to guide the mask assembly 210 and the seating plate 220 so that they can move in an aligned state with each other.

According to one embodiment of the present inventive concept, if the seating plate 220 moves to the +Z-axis direction by means of the first driving module 230 to pressurize the mask assembly 210 in the +Z-axis direction, the second protrusions 227 are inserted into the second holes 217 so that the mask assembly 210 and the seating plate 220 move integrally with each other.

According to one embodiment of the present inventive concept, the flanges 125 are formed correspondingly to open regions 228 formed on the periphery of the seating plate 220. For example, the flanges 125 are aligned with the open regions 228 of the seating plate 220 when viewed in the Z-axis direction.

According to one embodiment of the present inventive concept, the mask region 211 includes a metal. The mask region 211 is referred to as a fine metal mask (FMM) having patterns with sizes of several micrometers to tens of micrometers. The frame region 212 includes a metal having strength capable of supporting the mask region 211.

According to one embodiment of the present inventive concept, the micro patterns formed on the mask region 211 include a plurality of openings. For example, each opening may have a rectangular shape. In the deposition process, organic/metal materials passing through the rectangular openings are deposited on the wafer 201. For example, the organic/metal materials passing through one opening serve to form a single pixel (R, G, or B) of an OLED device. In this case, the rectangular opening has one side length in the range of 10 to 40 µm. For another example, the micro patterns include alignment marks for defining the position of the mask assembly 210. Each alignment mark has one side length in the range of 5 to 20 µm.

Figure 5:
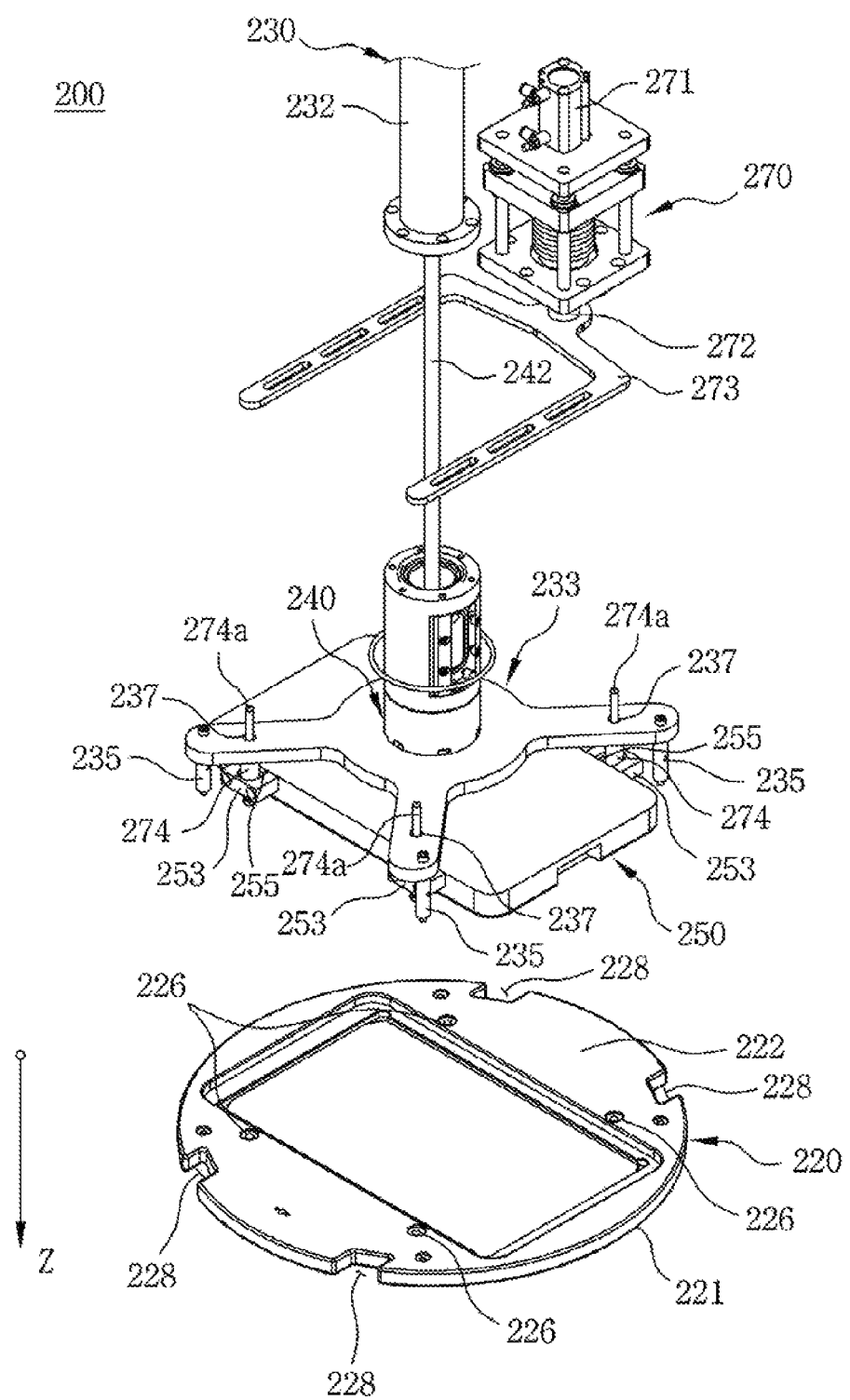
FIG. 5 is an exploded perspective view showing a portion of the contact structure of the deposition device according to the present inventive concept.

FIG. 4 is an exploded perspective view showing the contact structure of the deposition device according to the present inventive concept, and FIG. 5 is an exploded perspective view showing a portion of the contact structure of the deposition device according to the present inventive concept.

Referring first to FIG. 4, the contact structure 200 includes the mask assembly 210, the wafer 201, the seating plate 220 on which the wafer 201 is seated, the magnet structure 250, the first driving module 230, the second driving module 240, and the third driving module 270.

According to one embodiment of the present inventive concept, the wafer 201 is laid on underside of the mask region 211 of the mask assembly 210. For example, the wafer 201 is larger in size than the mask region 211 when viewed in the Z-axis direction. The wafer 201 is located on a first surface 221 of the seating plate 220. For example, the wafer 201 is located between the seating plate 220 and the mask assembly 210.

According to one embodiment of the present inventive concept, the seating plate 220 is configured to support the wafer 201. For example, the wafer 201 that moves from the transfer device 110 is seated on the seating plate 220. The wafer 201 is located on the first surface 221 of the seating plate 220, and the magnet structure 250 is located on a second surface 222 of the seating plate 220. The seating plate 220 is located between the wafer 201 and the magnet structure 250. The seating plate 220 moves in the Z-axis direction, together with the wafer 201 seated on the first surface 221.

According to one embodiment of the present inventive concept, the seating plate 220 is defined by a region on which the wafer 201 is seated and a peripheral region. The peripheral region has notches 229 formed thereon to align the wafer 201 therewith. For example, notches formed on the periphery of the wafer 201 to correspond to the notches 229 are inserted into the notches 229 to prevent the wafer 201 from rotating. In specific, the notches 229 serve to align the wafer 201 in a right direction.

According to one embodiment of the present inventive concept, the second protrusions 227 are formed on the peripheral region of the seating plate 220. The second protrusions 227 protrude in the +Z-axis direction. When the seating plate 220 moves in the +Z-axis direction, portions of the second protrusions 227 are inserted into the second holes 217 of the mask assembly 210. As a result, the seating plate 220 is aligned with the mask assembly 210 in the moving direction thereof.

According to one embodiment of the present inventive concept, the seating plate 220 may have third openings 226. Second connection members 274 as will be discussed later pass through the third openings 226 and then extend to the underside of the wafer 201. If the third driving module 270 operates, for example, the second connection members 274 pass through the third openings 226 and thus come into contact with the underside of the wafer 201. As a result, the third driving module 270 moves only the wafer 201 to the seating plate 220 by means of the second connection members 274.

According to one embodiment of the present inventive concept, the magnet structure 250 includes a magnet 251 and a magnet holder 252 for accommodating at least a portion of the magnet 251. The magnet 251 is configured to form an attractive force with the mask region 211 made of the metal material. The magnet 251 includes a plurality of sub magnets 259 as will be discussed later. At least a portion of the magnet 251 is surrounded with the magnet holder 252. As shown, for example, the edges of the magnet 251 are surrounded with the magnet holder 252. According to one embodiment of the present inventive concept, the magnet holder 252 is provided to surround the underside and sides of the magnet 251, but while being not limited thereto, it may have various shapes capable of holding the magnet 251. A first guide member 233 is coupled to the underside of the magnet holder 252.

According to one embodiment of the present inventive concept, the magnet holder 252 of the magnet structure 250 has protruding portions 253 from both sides thereof, respectively. Each protruding portion 253 has a first guide hole 255 formed thereon. The first guide hole 255 inserts at least a portion of each second connection member 274 disposed on the first guide member 233.

According to one embodiment of the present inventive concept, the second connection members 274 support the underside of the wafer 201, while adjusting the Z-axis direction of the wafer 201. For example, the second connection members 274 move in the Z-axis direction by means of the third driving module 270. In this case, the second connection members 274 move in the state of being inserted into the first guide holes 255, and accordingly, the wafer 201 moves in the Z-axis direction, without any shaking. The second connection members 274 pass through the third openings 226 and then extend to the underside of the wafer 201.

According to one embodiment of the present inventive concept, the magnet structure 250 moves independently in the Z-axis direction by means of the second driving module 240. The magnet structure 250 moves in the +Z-axis and −Z-axis directions in the state where the second connection members 274 of the first guide member 233 are inserted into the first guide holes 255 of the protruding portions 253. For example, the coupling between the first guide holes 255 and the second connection members 274 guides the movement of the magnet structure 250.

In summary, if the third driving module 270 operates, the first guide holes 255 are fixed in position, and the second connection members 274 move in the state of being inserted into the first guide holes 255. If the second driving module 240 operates, the second connection members 274 are fixed in position, and the first guide holes 255 move together with the magnet structure 250 in the state of inserting the second connection members 274. Like this, the second connection members 274 are guided by means of the first guide holes 255 or guide the movements of the first guide holes 255.

According to the present inventive concept, the contact structure 200 includes the first driving module 230, the second driving module 240, and the third driving module 270. Hereinafter, the first to third driving modules will be explained in detail with reference to FIGS. 4 to 6.

According to one embodiment of the present inventive concept, the first driving module 230 includes a first rod 232 linearly operating in the Z-axis direction, the first guide member 233, and first connection members 235. According to one embodiment of the present inventive concept, the first driving module 230 may include a linear driver configured to drive the first rod 232 in the +Z-axis and −Z-axis directions.

According to one embodiment of the present inventive concept, the first rod 232 extends long in the +Z-axis direction. The first guide member 233 is coupled to the end of the first rod 232. For example, if the first driving module 230 operates, the first rod 232 and the first guide member 233 moves in the +Z-axis or −Z-axis direction, and accordingly, the magnet structure 250 coupled to the first guide member 233 moves.

According to one embodiment of the present inventive concept, the first guide member 233 is coupled to the underside of the magnet holder 252 and the end of the first rod 232. The first guide member 233 includes extension portions 234 extending outwardly from the sides of the magnet holder 252. As shown, the first guide member 233 is X-shaped. For example, at least portions of the extension portions 234 of the first guide member 233 face the second surface 222 of the seating plate 220. The first connection members 235 and the second connection members 274 are located on the extension portions 234 of the first guide member 233.

According to one embodiment of the present inventive concept, the first connection members 235 and the second connection members 274 are plurally provided. For example, the first guide member 233 includes four extension portions 234 facing the second surface 222 of the seating plate 220, and four first connection members 235 are located on the four extension portions 234, respectively. Further, four second connection members 274 are located on the four extension portions 234, respectively. As shown, the first connection members 235 are located more outwardly when compared with the second connection members 274.

According to one embodiment of the present inventive concept, the first connection members 235 are configured to come into contact with the second surface 222 of the seating plate 220 on which the wafer 201 is seated. Accordingly, if the first driving module 230 operates, the first rod 232, the first guide member 233, and the magnet structure 250 move in the +Z-axis and −Z-axis directions, and the seating plate 220 on which the wafer 201 is seated moves in the Z-axis direction by means of the first connection members 235 located on the first guide member 233.

According to one embodiment of the present inventive concept, the first driving module 230 is configured to move the magnet structure 250 and the wafer 201 together. The first driving module 230 moves the magnet structure 250 and/or the wafer 201 in the direction (for example, in the +Z-axis direction) close to the second cover 122 of the deposition device 120 or in the direction (for example, in the −Z-axis direction) distant from the second cover 122.

According to one embodiment of the present inventive concept, each extension portion 234 of the first guide member 233 has a second guide hole 237 formed to pass therethrough. The second guide hole 237 is adapted to insert at least a portion of each second connection member 274.

According to one embodiment of the present inventive concept, the second guide holes 237 serve to guide the moving direction (for example, the Z-axis direction) of the second connection members 274 when the second connection members 274 move by means of the third driving module 270. The number of second guide holes 237 corresponds to the number of second connection members 274. The second guide holes 237 are formed closer to the magnet 251 than the first connection members 235. For example, the second guide holes 237 are located between the magnet 251 and the first connection members 235 when the first guide member 233 is viewed on top (in the +Z-axis direction).

According to one embodiment of the present inventive concept, the second driving module 240 is located on the first rod 232 of the first driving module 240. For example, the second driving module 240 is located close to the end of the first rod 232. The second driving module 240 is connected to the magnet structure 250. The second driving module 240 is configured to move the magnet structure 250. For example, when the second driving module 240 operates, the first guide member 233, the seating plate 220, and the wafer 201 are fixed in position, and only the magnet structure 250 moves in the Z-axis direction. According to one embodiment of the present inventive concept, the second driving module 240 includes a second rod 242 extending long in the Z-axis direction, and the second rod 242 moves in the +Z-axis and −Z-axis directions according to the operation of the second driving module 240. The movement of the second rod 242 allows the movement of the magnet structure 250.

According to one embodiment of the present inventive concept, as the second driving module 240 operates, the magnet structure 250 moves, and the movement of the magnet structure 250 is guided by means of the second connection members 274 and the first guide holes 255. The first guide holes 255 are formed on the protruding portions 253 protruding outwardly from the magnet holder 252, and the second connection members 274 are inserted into the first guide holes 255 and extend outwardly. According to one embodiment of the present inventive concept, if the second driving module 240 operates, the second connection members 274 are kept in the state of being fixed to the first guide member 233, and the magnet structure 250 moves, while keeping the state where the second connection members 274 are inserted into the first guide holes 255. As a result, the magnet structure 250 moves in the +Z-axis and −Z-axis directions, without any shaking.

According to one embodiment of the present inventive concept, the second driving module 240 operates independently of the first driving module 230. For example, the first driving module 230 operates to allow the deposition surface of the wafer 201 to come into contact with the mask region 211 of the mask assembly 210, and further, the second driving module 240 operates to adjust a gap between the magnet 251 and the mask assembly 210.

According to one embodiment of the present inventive concept, the third driving module 270 is configured to move the wafer 201 in the Z-axis direction. For example, if the arm member 111 enters the inside of the deposition device 120, together with the wafer 201, the third driving module 270 moves the wafer 201 in the +Z-axis direction to release the contact state between the wafer 201 and the arm member 111. After that, if the arm member 111 moves to the outside of the deposition device 120 again, the third driving module 270 moves the wafer 201 in the −Z-axis direction to seat the wafer 201 on the first surface 221 of the seating plate 220.

According to one embodiment of the present inventive concept, the third driving module 270 includes a third driver 271, a third rod 272, a second guide member 273, and the second connection members 274. According to the present inventive concept, the third driver 271 includes a linear driver for operating the third rod 272 and the second guide member 273 in the +Z-axis and −Z-axis directions. The second guide member 273 is coupled to the third rod 272 and moves integrally with the third rod 272 in the +Z-axis and −Z-axis directions.

As shown, the second guide member 273 is t-shaped, but without being limited thereto, it may have various shapes coming into contact with first portions 274a as will be discussed later of the second connection members 274. As shown, the second guide member 273 operates independently of the first rod 232 of the first driving module 230. For example, the second guide member 273 is spaced apart from the first rod 232, while partially surrounding the first rod 232, and accordingly, there is no interference between the movement of the first driving module 230 and the movement of the third driving module 270.

According to one embodiment of the present inventive concept, the second guide member 273 is configured to pressurize the first portions 274a of the second connection members 274. The second connection members 274 include the first portions 274a passing through the first guide member 233 via the second guide holes 237. For example, the first portions 274a of the second connection members 274 have a thinner thickness than the other portion thereof. As a result, the second connection members 274 freely move in the Z-axis direction in the state of being inserted into the second guide holes 237. The first portions 274a of the second connection members 274 come into contact with the second guide member 273. For example, if the third driving module 270 operates to move the second guide member 273 in the +Z-axis direction, the second guide member 273 pressurizes the first portions 274a of the second connection members 274, and the second connection members 274 pressurize the underside of the wafer 201 to ascend the wafer 201 in the +Z-axis direction.

According to one embodiment of the present inventive concept, the second connection members 274 extend to pass through the second guide holes 237 formed on the first guide member 233 and the first guide holes 255 formed on the magnet holder 252. As a result, if the second connection members 274 move in the +Z-axis and −Z-axis directions, the seating plate 220, the magnet structure 250, and the first guide member 233 are fixed in position, without any movements.

Referring to FIG. 5, the second connection members 274 extend through the third openings 226 formed on the seating plate 220 and thus come into contact with the underside of the wafer 201.

According to one embodiment of the present inventive concept, if the third driving module 270 operates, the third rod 272 and the second guide member 273 move in the +Z-axis and −Z-axis directions, and the second connection members 274 move in the +Z-axis and −Z-axis directions in the state of being inserted into the first guide holes 255 and the second guide holes 237. In this case, the ends of the second connection members 274 come into contact with the underside of the wafer 201 and thus move the position of the wafer 201.

According to one embodiment of the present inventive concept, the first driving module 230, the second driving module 240, and the third driving module 270 operate independently of one another. The first driving module 230 moves the seating plate 220 on which the wafer 201 is seated and the magnet 251 together. The second driving module 240 moves the magnet 251. For example, the second driving module 240 changes a distance between the magnet 251 and the seating plate 220. The third driving module 270 moves the wafer 201. For example, the third driving module 270 changes a gap between the wafer 201 and the seating plate 220.

According to other embodiments of the present inventive concept, each of the first driving module 230, the second driving module 240, and the third driving module 270 includes a driver with various mechanisms. For example, as the driver, a hydraulic actuator with a piston or a motor with a gear box may be provided.

Figure 6:
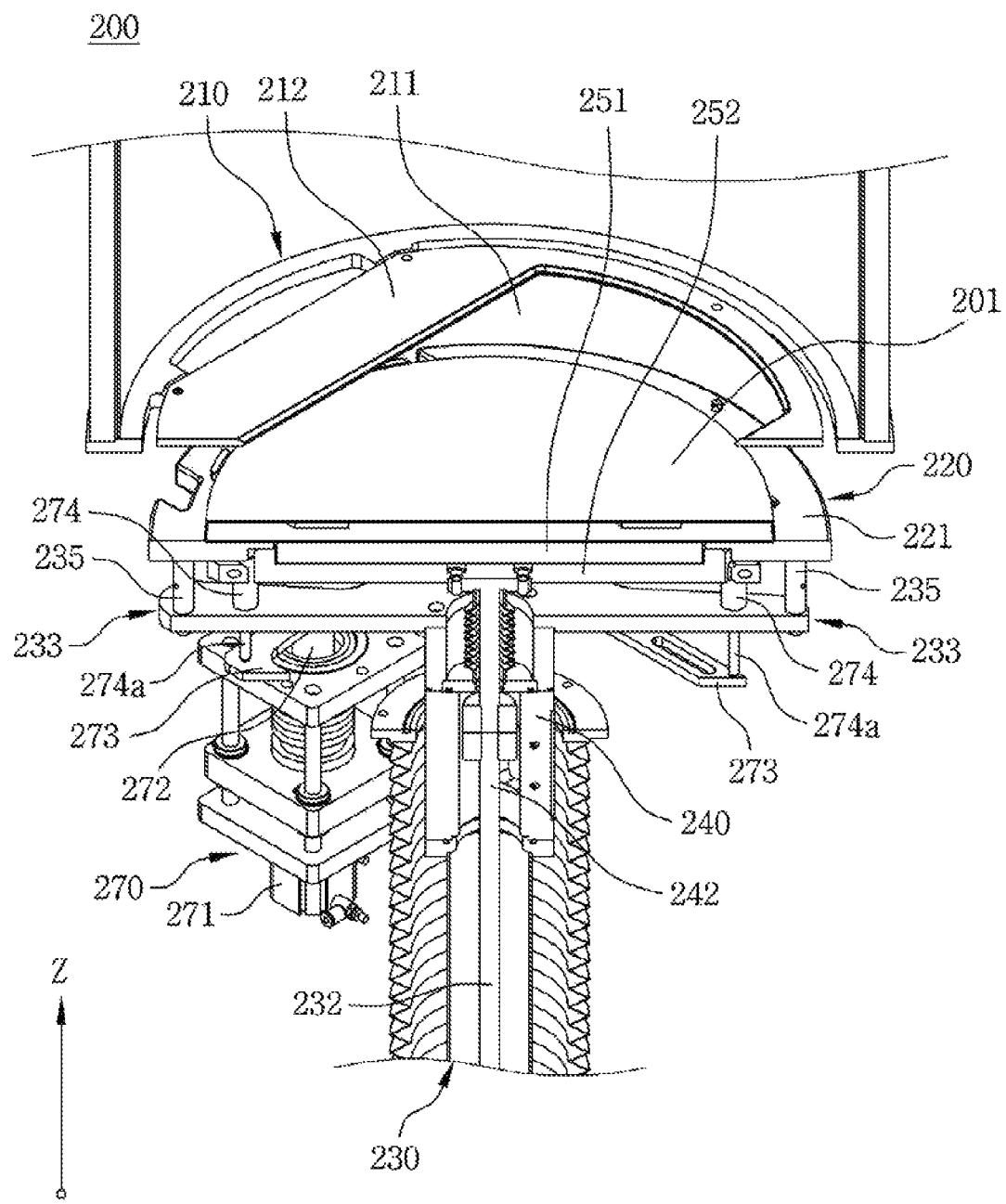
FIG. 6 is a sectional view showing the contact structure of the deposition device according to the present inventive concept.

FIG. 6 is a sectional view showing the contact structure of the deposition device according to the present inventive concept.

Referring to FIG. 6, at least portions of the mask assembly 210 and the wafer 201 are disposed to face each other. The wafer 201 is seated on the first surface 221 of the seating plate 220, and the magnet 251 is disposed on the second surface 222 of the seating plate 220. The magnet 251 is coupled to the first guide member 233 by means of the magnet holder 252 so that it can move integrally with the first guide member 233.

According to one embodiment of the present inventive concept, if the first driving module 230 operates, the first rod 232, the first guide member 233, the first connection members 235, the second connection members 274, the magnet structure 250, the seating plate 220, and the wafer 201 move together. The first connection members 235 are disposed fixedly to the first guide member 233 and come into contact with the second surface 222 of the seating plate 220. The second connection members 274 move in the state of being fixed between the first guide member 233 and the seating plate 220.

According to one embodiment of the present inventive concept, if the second driving module 240 operates, the second rod 242 and the magnet structure 250 move together. In this case, the first guide member 233, the wafer 201, and the seating plate 230 do not move. Accordingly, the second driving module 230 adjusts the gap between the magnet 251 and the wafer 201 or between the magnet 251 and the mask assembly 210.

According to one embodiment of the present inventive concept, if the third driving module 270 operates, the second connection members 274 and the wafer 201 move together. The second connection members 274 are separated from or come into contact with the ⊏-shaped second guide member 273 of the third driving module 270. Accordingly, the third driving module 270 moves only the wafer 201 to thus adjust the gap between the wafer 201 and the seating plate 220. Through the gap between the wafer 201 and the seating plate 220, the arm member 111 moves.

FIG. 7 is a flowchart showing some of a wafer loading process of the deposition device according to the present inventive concept, and FIGS. 8A to 8E are sectional views showing the deposition device in the wafer loading process of FIG. 7.

A wafer loading process S300 is carried out before step S307 of starting a deposition process on the wafer 201. Through the wafer loading process S300, the wafer 201 moves to a given position inside the deposition device 120.

According to one embodiment of the present inventive concept, the wafer loading process S300 includes the steps of: moving the wafer 201 inside the transfer device 110 to the inside (for example, the chamber 121) of the deposition device 120 through the arm member 111 (S301); moving the wafer 201 in the +Z-axis direction through the third driving module 270 to allow the wafer 201 to be separated from the arm member 111 (S302); moving the arm member 111 to the outside of the deposition device 120 (S303); moving the wafer 201 in the −Z-axis direction through the third driving module 270 to allow the wafer 201 to be seated on the first surface 221 of the seating plate 220 (S304); moving the magnet structure 250 and the seating plate 220 in the +Z-axis direction through the first driving module 230 to allow the deposition surface of the wafer 201 to come into contact with the mask region 211 (S305); and moving the magnet structure 250 in the +Z-axis direction through the second driving module 240 to allow the magnet 241 and the mask region 211 to have a given gap therebetween (S306).

According to one embodiment of the present inventive concept, the step (S301) of moving the wafer 201 inside the transfer device 110 to the inside (for example, the chamber 121) of the deposition device 120 through the arm member 111 further includes the step of: opening a door located between the deposition device 120 and the transfer device 110. For example, the door serves to keep a pressure difference between the inside of the deposition device 120 and the inside of the transfer device 110. For example, the inside of the transfer device 110 is at a relatively low vacuum level, and the inside of the deposition device 120 is at a relatively high vacuum level. That is, the inside of the deposition device 120 has a higher vacuum level than the inside of the transfer device 110. The arm member 111 moves in the +Y-axis direction. The arm member 111 moves in a state of supporting the underside of the wafer 201. For example, the door is open and closed to allow the fluid in the load lock chamber 113 of the transfer device 110 and the fluid in the chamber 121 of the deposition device 120 to communicate with each other or to be blocked from each other.

According to one embodiment of the present inventive concept, at the step (S302) of moving the wafer 201 in the +Z-axis direction through the third driving module 270 to allow the wafer 201 to be separated from the arm member 111, the third driving module 270 moves the second guide member 273 and the second connection members 274 in the +Z-axis direction. In this case, the second connection members 274 are inserted into the first guide holes 255 and the second guide holes 237 and thus guided in the moving directions. The second connection members 274 pressurize the underside of the wafer 201 in the +Z-axis direction to move the wafer 201 in the +Z-axis direction. In this case, the contact state between the wafer 201 and the arm member 111 is released.

According to one embodiment of the present inventive concept, at the step (S303) of moving the arm member 111 to the outside of the deposition device 120, the arm member 111 moves in the −Y-axis direction. In this case, the arm member 111 is separated from the wafer 201, and accordingly, only the arm member 111 moves to the transfer device 110.

According to one embodiment of the present inventive concept, at the step (S304) of moving the wafer 201 in the −Z-axis direction through the third driving module 270 to allow the wafer 201 to be seated on the first surface 221 of the seating plate 220, the third driving module 270 moves the second connection members 274 in the −Z-axis direction. In this case, the second connection members 274 are inserted into the first guide holes 255 and the second guide holes 237 and thus guided in the moving directions. The wafer 201 moves together with the second connection members 274 in the −Z-axis direction, and then, the wafer 201 is seated on the seating plate 220. Even after the wafer 201 is seated, the second connection members 274 move further by a given distance in the −Z-axis direction.

According to one embodiment of the present inventive concept, at the step (S305) of moving the magnet structure 250 and the seating plate 220 in the +Z-axis direction through the first driving module 230 to allow the deposition surface of the wafer 201 to come into contact with the mask region 211, the first driving module 230 moves all of the second driving module 240, the magnet structure 250, the first guide member 233, the first connection members 235, the second connection members 274, the seating plate 220, and the wafer 201. In this case, the first driving module 230 moves the deposition surface of the wafer 201 further by a given distance in the −Z-axis direction even after the deposition surface of the wafer 201 has come into contact with the mask region 211. As mentioned above, the first protrusions 126 of the flanges 125 are inserted into the first holes 216 of the mask assembly 210, and accordingly, the mask assembly 210 and the support structure 124 can be aligned with each other.

According to one embodiment of the present inventive concept, at the step (S306) of moving the magnet structure 250 in the +Z-axis direction through the second driving module 240 to allow the magnet 241 and the mask region 211 to have a given gap therebetween, the second driving module 240 moves only the magnet structure 250. In this case, the wafer 201, the seating plate 220, and the first guide member 233 are fixed in position, without any movements. Accordingly, the second driving module 240 changes the gap between the magnet 251 and the mask region 211 or between the magnet 251 and the wafer 201. For example, the second driving module 240 moves the magnet 251 to allow the magnet 251 to be separated from the wafer 201 by a given gap or from the mask region 211 by a given gap. In this case, the given gap is the distance in which a magnetic field is sufficiently formed in the mask region 211 to allow the mask region 211 to come into close contact with the wafer 201. For example, the magnetic field that is measured on the surface of the wafer 201 or the mask region 211 may be varied according to the gap between the magnet 251 and the wafer 201 or between the magnet region 211 and the wafer 201. According to other embodiments of the present inventive concept, the magnet structure 250 further includes a metal plate to finely control the magnetic field. For example, if the metal plate comes into contact with the magnet 251, the magnetic field may be increased.

FIG. 9 is a flowchart showing some of a wafer unloading process of the deposition device according to the present inventive concept, and FIGS. 10A to 10E are sectional views showing the deposition device in the wafer unloading process of FIG. 9.

A wafer unloading process S400 is carried out to remove the deposited wafer 201 after the deposition process has been finished through the deposition device 120.

According to one embodiment of the present inventive concept, the wafer unloading process (S400) includes the steps of: moving the magnet structure 250 in the −Z-axis direction through the second driving module 240 (S402); moving the magnet structure 250 and the seating plate 220 in the −Z-axis direction through the first driving module 230 to allow the deposition surface of the wafer 201 to be separated from the mask region 211 (S403); moving the wafer 201 in the +Z-axis direction through the third driving module 270 to allow the wafer 201 to be separated from the first surface 221 of the seating plate 220 (S404); allowing the arm member 111 to enter the space between the wafer 201 and the first surface 221 of the seating plate 220 (S405); moving the wafer 201 in the −Z-axis direction through the third driving module 270 to allow the wafer 201 to be seated on the arm member 111 (S406); and moving the arm member 111 and the wafer 201 to the inside of the transfer device 110 (S407).

According to one embodiment of the present inventive concept, at the step (S402) of moving the magnet structure 250 in the −Z-axis direction through the second driving module 240, the distance between the magnet 251 and the mask region 211 is increased. That is, the magnet 251 first moves before the movements of other structures. For example, if the magnet 251 and the mask region 211 move in a close state to each other through the first driving module 230, the mask region 211 and the deposited wafer 201 may be damaged or broken due to strong attractive force between the magnet 251 and the frame region 212 of the mask assembly 210. At the step of S402, accordingly, the distance between the magnet 251 and the mask region 211 is increased, and next, at the step of S403, the magnet 251, the mask assembly 210, and the wafer 201 move together.

According to one embodiment of the present inventive concept, at the step (S403) of moving the magnet structure 250 and the seating plate 220 in the −Z-axis direction through the first driving module 230 to allow the deposition surface of the wafer 201 to be separated from the mask region 211, the mask assembly 210 moves by a given distance and is then kept to a state of being locked on the flanges 125 of the support structure 124, without any movement in the −Z-axis direction. As mentioned above, the first protrusions 126 of the flanges 125 are inserted into the first holes 216 of the mask assembly 210, so that the mask assembly 210 and the support structure 124 can be aligned with each other.

According to one embodiment of the present inventive concept, at the step (S404) of moving the wafer 201 in the +Z-axis direction through the third driving module 270 to allow the wafer 201 to be separated from the first surface 221 of the seating plate 220, a given space is formed between the wafer 201 and the seating plate 220.

According to one embodiment of the present inventive concept, at the step (S405) of allowing the arm member 111 to enter the given space between the wafer 201 and the first surface 221 of the seating plate 220, the arm member 111 moves to the space between the wafer 201 and the seating plate 220. In this case, the step of S405 may further include the step of opening the door located between the deposition device 120 and the transfer device 110. For example, after the door is open, the arm member 111 moves to the inside of the deposition device 120. For example, the door is open and closed to allow the fluid in the load lock chamber 113 of the transfer device 110 and the fluid in the chamber 121 of the deposition device 120 to communicate with each other or to be blocked from each other.

According to one embodiment of the present inventive concept, at the step (S406) of moving the wafer 201 in the −Z-axis direction through the third driving module 270 to allow the wafer 201 to be seated on the arm member 111, the second driving module 240 moves the second connection members 274 in the −Z-axis direction. The wafer 201 supported against the second connection members 274 moves in the −Z-axis direction, together with the second connection members 274. Even after the wafer 201 is seated on the arm member 111, the second connection members 274 move further by a given distance.

According to one embodiment of the present inventive concept, at the step (S407) of moving the arm member 111 and the wafer 201 to the inside of the transfer device 110, the arm member 111 moves in the −Y-axis direction in the state of seating the wafer 201 thereon. After the step of S407 has been performed, the step of closing the door located between the transfer device 110 and the deposition device 120 is carried out. For example, the door is open and closed to allow the fluid in the load lock chamber 113 of the transfer device 110 and the fluid in the chamber 121 of the deposition device 120 to communicate with each other or to be blocked from each other.

Figure 11:
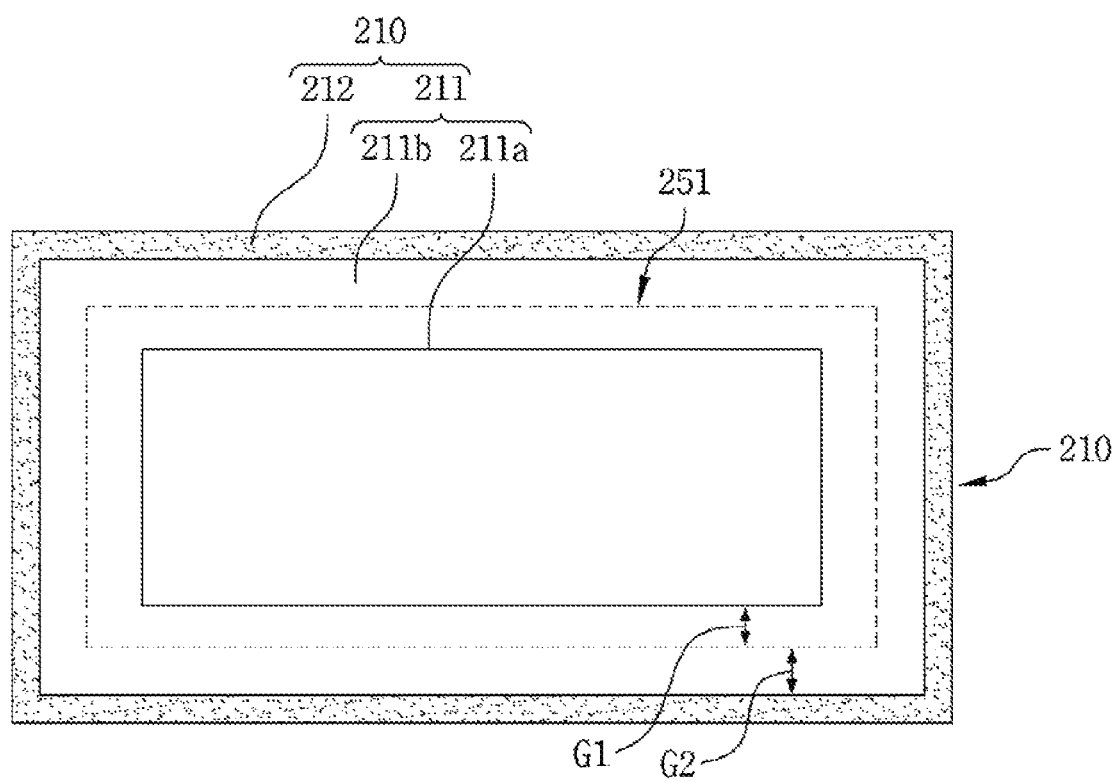
FIG. 11 is a top view showing the mask assembly and magnet of the contact structure of the deposition device according to the present inventive concept.

FIG. 11 is a top view showing the mask assembly and magnet of the contact structure of the deposition device according to the present inventive concept. FIG. 11 is a top view of the mask assembly (for example, in the +Z-axis direction).

Referring to FIG. 11, the mask assembly 210 includes the mask region 211 and the frame region 212 formed around the mask region 211. According to one embodiment of the present inventive concept, the mask region 211 includes a first region 211a and a second region 211b formed around the first region 211a. For example, the first region 211a is the region in which the micro patterns through which the deposition materials pass in the deposition process are included. The second region 211b is defined as the region between the first region 211a and the frame region 212, and the second region 211b means the region in which the micro patterns are not formed, the region not utilized in the deposition process even in the case where the micro patterns are formed, or the region coming into contact with the region cut from the deposited wafer 201.

Referring to FIG. 11, when the mask assembly 210 is viewed on top, the magnet 251 is provided to entirely cover the first region 211a of the mask assembly 210. For example, the edges of the magnet 251 are spaced apart from the edges of the first region 211a by a first distance G1. The first distance G1 is equal to or greater than 10 mm. This is to allow the entire first region 211a of the mask assembly 210 to come into close contact with the wafer 201. Accordingly, the magnetic field is uniformly applied to the central portion and edges of the first region 211a, so that the first region 211a comes into close contact with the wafer 201 uniformly to provide an improved quality of deposition.

Referring to FIG. 11, according to one embodiment of the present inventive concept, when the mask assembly 210 is viewed on top, the edges of the magnet 251 are spaced apart from the frame region 212 of the mask assembly 210 by a second distance G2. For example, the second distance G2 is equal to or greater than 20 mm. Since the frame region 212 is thicker than the mask region 211, a strong attractive force between the magnet 251 and the frame region 212 is generated, and accordingly, the magnet 251 or the frame region 212 may move during the deposition process. According to the present inventive concept, the magnet 251 of the contact structure 250 is spaced part from the frame region 212 by a distance of at least 20 mm or more.

Figure 12A:
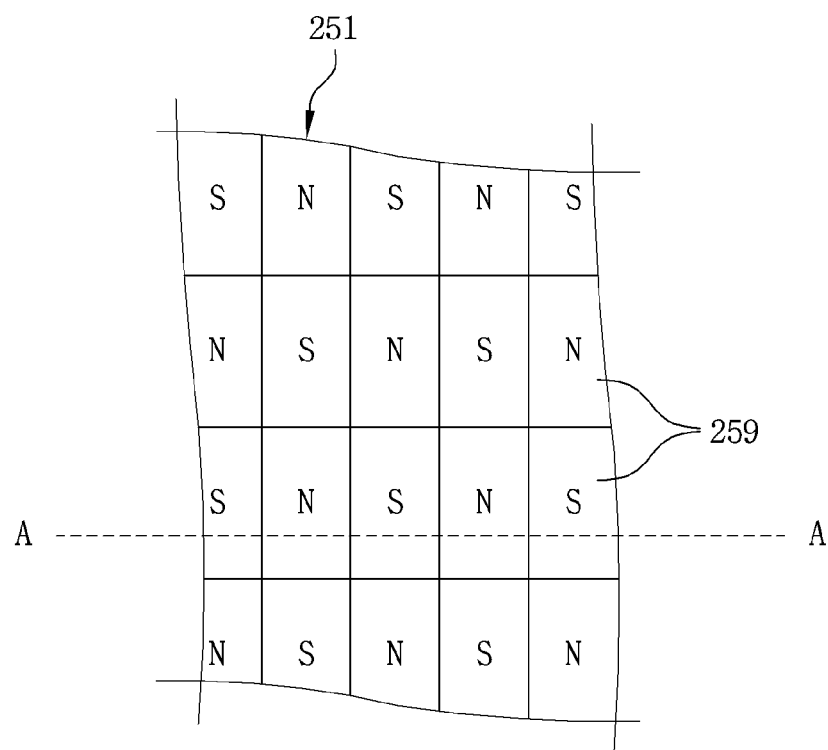
FIGS. 12A and 12B are top and sectional views showing the magnet of the deposition device according to the present inventive concept.
Figure 12B:
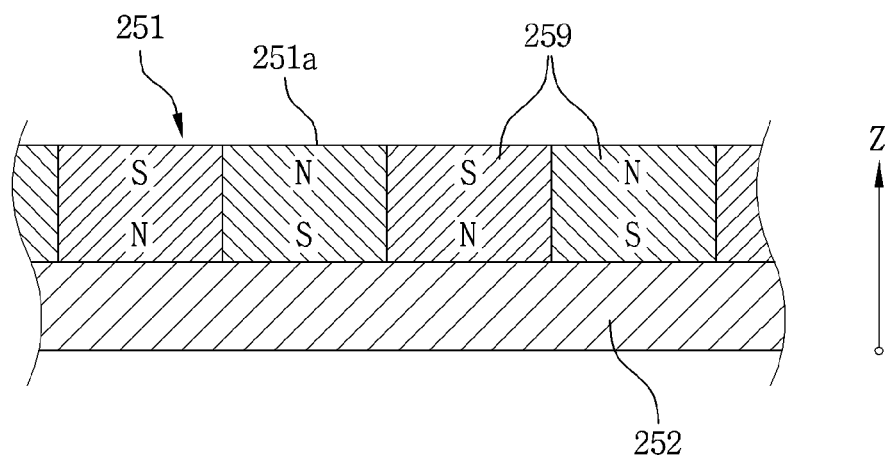

FIGS. 12A and 12B show the magnet of the deposition device according to the present inventive concept.

FIG. 12A is a plan view showing a given region of the magnet. FIG. 12B is a sectional view taken along the line A-A of FIG. 12A.

Referring to FIGS. 12A and 12B, the magnet 251 includes the plurality of sub magnets 259. The neighboring sub magnets 259 are arranged to have surface contacts with one another. For example, the sub magnets 259 are arranged in a state of coming into contact with one another, without being spaced apart from one another. Through such arrangements of the sub magnets 259, the magnetic field is uniformly formed on the surface of the wafer 201, and further, the wafer 201 and the mask region 211 come into close contact with each other uniformly, thereby reducing a failure rate, improving a quality of deposition, and especially giving many advantages in micro pattern deposition process such as micro LED production process.

Referring to FIGS. 12A and 12B, the sub magnets 259 form one surface 251a of the magnet 251. A single sub magnet 259 forms the N pole area, and another sub magnet 259 coming into contact with at least a portion of the single sub magnet 259 forms the S pole area. For example, the N pole area and the S pole area are alternately arranged repeatedly on one surface 251a of the magnet 251.

According to one embodiment of the present inventive concept, the magnet 251 is provided to have the magnetic field in the range of 500 to 2500 G, which is measured on the surface of the wafer 201. According to one embodiment of the present inventive concept, the wafer 201 has a thickness in the range of 0.5 to 2.0 T. The wafer 201 desirably has a thickness of 1.5 T. According to one embodiment of the present inventive concept, the mask region 211 has a thickness in the range of 5 to 15 μm. The mask region 211 desirably has a thickness of 10 μm.

According to the embodiments of the present inventive concept, the deposition system 100 is provided. The deposition system 100 includes: the deposition device 120 having the chamber 121, the seating plate 220 located inside the chamber 121 to seat the wafer 201, the magnet 251 coupled to the underside of the seating plate 220, and the mask assembly 210 located inside the chamber 121 to allow at least a portion thereof to face the wafer 201; and the transfer device 110 having the load lock chamber 112 for accommodating the wafer 201, the arm member 111 for transferring the wafer 201 from the load lock chamber 112 to the seating plate 220, and the fourth driving module 115 for moving the arm member 111, wherein the deposition device 120 comprises the first driving module 230 for moving the magnet 251 and the seating plate 220, the second driving module 240 coupled to the first driving module 230 to move the magnet 251, the third driving module 270 for moving the wafer 201, and a control module for controlling the first driving module 230, the second driving module 240, the third driving module 270, and the fourth driving module 115, the control module being configured to perform the wafer loading process (S300) before the deposition process and the wafer unloading process (S400) after the deposition process.

According to other embodiments of the present inventive concept, the control module in the wafer loading process (S300) is configured to perform the steps of: moving the arm member 111 and the wafer 201 onto the seating plate 220 through the fourth driving module 115; moving the wafer 201 in a first direction through the third driving module 270 to allow the wafer 201 to be separated from the arm member 111; moving the arm member 111 to the load lock chamber 112 through the fourth driving module 115; moving the wafer 201 in a second direction opposite to the first direction through the third driving module 270 to allow the wafer 201 to be seated on the seating plate 220; and allowing the wafer 201 to come into contact with the mask region 211 of the mask assembly 210 through the first driving module 230 and the second driving module 240 to form a magnetic field with a given range on the deposition surface of the wafer 201.

According to other embodiments of the present inventive concept, the control module in the step of allowing the wafer 201 to come into contact with the mask region 211 is configured to perform the steps of: moving the magnet 251, the wafer 201, and the seating plate 220 in the first direction through the first driving module 230 until the wafer 201 comes into contact with the mask region 211; and moving the magnet 251 in the first direction through the second driving module 240 to allow the distance between the magnet 251 and the mask region 211 to have a given value.

According to other embodiments of the present inventive concept, the arm member 111 moves in third directions vertical to the first direction and the second direction, respectively, through the fourth driving module 115.

According to other embodiments of the present inventive concept, the wafer 201 is located between the magnet 251 and the mask region 211 when viewed in the first direction.

According to other embodiments of the present inventive concept, the first driving module 230 includes the first rod 232 moving in the first or second direction, and the second driving module 240 is coupled to the first rod 232 so that when the first driving module 230 operates, the second driving module 240 moves in the first or second direction, together with the magnet 251, the seating plate 220, and the wafer 201.

According to other embodiments of the present inventive concept, the third driving module 270 includes the second connection members 274 passing through the seating plate 220 to come into contact with the underside of the wafer 201, and the second connection members 274 move in the first or second direction to change the position of the wafer 201 when the third driving module 270 operates.

According to other embodiments of the present inventive concept, the magnet 251 includes the plurality of sub magnets 259, and the neighboring sub magnets 259 are arranged to have surface contacts with one another.

According to other embodiments of the present inventive concept, the control module in the wafer unloading process (S400) is configured to perform the steps of: moving the magnet 251 in the second direction through the second driving module 240 after the deposition process; moving the magnet 251, the wafer 201 and the seating plate 220 in the second direction through the first driving module 230 to allow the wafer 201 to be separated from the mask region 211 of the mask assembly 210; moving the wafer 201 in the first direction through the third driving module 270 to allow the wafer 201 to be separated from the seating plate 220; moving the arm member 111 to the space between the wafer 201 and the seating plate 220 inside the chamber 121 through the fourth driving module 115; moving the wafer 201 in the second direction through the third driving module 270 to allow the wafer 201 to be seated on the arm member 111; and moving the arm member 111 and the wafer 201 seated on the arm member 111 to the load lock chamber 112 of the transfer device 110 through the fourth driving module 115.

According to other embodiments of the present inventive concept, the deposition system 100 further includes the door open and closed to allow the fluid in the load lock chamber 113 of the transfer device 110 and the fluid in the chamber 121 of the deposition device 120 to communicate with each other or to be blocked from each other, and the chamber 121 has a relatively higher vacuum level than the load lock chamber 113.

According to other embodiments of the present inventive concept, the deposition device 120 is provided. The deposition device 120 includes: the chamber 121; the mask assembly 210 located inside the chamber 121 and having the mask region 211 made of a metal material and having micro patterns and the frame region 212 formed around the mask region 211; the seating plate 220 located inside the chamber 121 and having the first surface 221 on which the wafer 201 is seated and the second surface 222 opposite to the first surface 221, at least a portion of the wafer 201 being disposed to face the mask assembly 210; the magnet structure 250 located on the second surface 222 of the seating plate 220 inside the chamber 121 and having the magnet 251 and the magnet holder 251 for accommodating at least a portion of the magnet 251; the first driving module 230 for moving the magnet structure 250 and the seating plate 220 in the first direction; the second driving module 240 for moving the magnet structure 250 in the first direction; and the control module for controlling the first driving module 230 and/pr the second driving module 240 to adjust the distance between the magnet 251 and the mask region 211.

According to other embodiments of the present inventive concept, the magnet 251 includes the plurality of sub magnets 259, and the neighboring sub magnets 259 are arranged to have surface contacts with one another.

According to other embodiments of the present inventive concept, the sub magnets 259 form the surface 251a of the magnet 251 facing the wafer 201, and the N pole area and the S pole area are alternately arranged repeatedly on the facing surface 251a.

According to other embodiments of the present inventive concept, the mask region 211 includes the first region 211a on which the micro patterns are formed and the second region 211b formed around the first region 211a, the magnet 251 is provided to entirely cover the first region 211a of the mask assembly 210, and when the mask region 211 is viewed on top, the edges of the magnet 251 are spaced apart from the edges of the first region 211a by a distance of at least 10 mm or more.

According to other embodiments of the present inventive concept, when the mask region 211 is viewed on top, the edges of the magnet 251 are overlaid on top of the second region 211b, and the edges of the magnet 251 are spaced apart from the edges of the frame region 212 by a distance of at least 20 mm or more.

According to other embodiments of the present inventive concept, the mask region 211 has a thickness in the range of 5 to 15 μm, the wafer 201 has a thickness in the range of 0.5 to 2.0 T, and the magnet 251 is spaced apart from the mask region 211 by a given distance to have a magnetic field in the range of 500 to 2500 G, which is measured on the surface of the wafer 201.

According to other embodiments of the present inventive concept, the first driving module 230 includes the first rod 232 moving in the first direction and the first guide member 233 coupled to the first rod 232, the magnet structure 250, and the seating plate 220, the second driving module 240 is coupled to the first rod 232 and the magnet structure 250, and the control module operates the first driving module 230 to allow the wafer 201 and the mask region 211 to come into close contact with each other and the second driving module 240 to adjust the distance between the magnet structure 250 and the wafer 201.

According to other embodiments of the present inventive concept, the deposition device 120 further includes the third driving module 270 for moving the wafer 201, and the third driving module 270 includes the second connection members 274 extending to pass through the first guide member 233 and the seating plate 220 and to thus come into contact with the underside of the wafer 201.

According to other embodiments of the present inventive concept, the mask holder 252 include the protruding portions 253 from both sides thereof, respectively, and each protruding portion 253 has the first guide hole 255 formed thereon to insert at least a portion of each second connection member 274.

As described above, the deposition device according to the present inventive concept can provide a uniform, improved contact force between the wafer and the patterned mask, thereby reducing a failure rate occurring in the deposition process of the micro patterns. According to the present inventive concept, further, the magnet and the wafer move independently of each other, thereby easily controlling the distance between the magnet and the mask assembly, so that the present inventive concept may be applied to the patterned masks and wafers having various thicknesses.

According to the embodiments of the present inventive concept, the deposition system can provide a uniform, improved contact force between the wafer and the patterned mask, thereby reducing a failure rate occurring in the deposition process of the micro patterns. According to the present inventive concept, further, the deposition system includes the transfer device operating cooperatively with the contact structure having the magnet in the deposition device, thereby automatically loading and unloading the wafer on and from the deposition device through the transfer device.

In addition thereto, the deposition system and the deposition device according to the present inventive concept can provide various advantages directly or indirectly obtained therethrough.

The foregoing description of the embodiments of the invention and the terminology used herein are not intended to be exhaustive or to limit the invention to the precise forms disclosed. Persons skilled in the relevant art can appreciate that many modifications and variations are possible in light of the above teachings. In the description, it should be noted that the parts corresponding to those of the drawings are indicated by corresponding reference numerals. An expression referencing a singular value additionally refers to a corresponding expression of the plural number, unless explicitly limited otherwise by the context. In the description, if a composition is described as containing A or B, at least one of A and/or B, A, B or C, or at least one of A, B and/or C, it can contain all combinations of the items listed. Also, in explaining elements, terms like "first", "second", "A", "B", "(a)", "(b)", etc. may be used. However, such terms are used to distinguish one from the others only and they do not affect the essence, nature, sequence, order, etc. When it is said that one element (for example, a first element) is described as being "connected" or "coupled (functionally or in communication)" to the other element (for example, a second element), one element may be directly connected or coupled to the other element, but it should be understood that another element (for example, a third element) may be present between the two elements.

In the description, the term "adapted to or configured to) may be interchangeably used with the term "adequate to", "capable of something", "changed to", "made to", "able to", or "designed to" according to situations, for example, hardwarily or softwarily. In some situations, the term "device configured to" means that the device is capable of something together with other devices and parts. For example, the term "processor set (configured) to execute A, B, and C" means a dedicated processor (for example, embedded processor) for performing the corresponding operations or a general processor (for example, CPU or AP) for executing one or more programs stored in a memory device (for example, memory) to perform the corresponding operations.

The term "module", as used herein, is intended to refer to the unit that may be implemented by hardware, software or firmware. For example, the module may be used interchangeably with the term "logic", "logic block", "part", or "circuit". The module may become an integral part or a minimum unit or a portion thereof that implements one or more functions. For example, the module may include an Application-Specific Integrated Circuit (ASIC) chip, Field-Programmable Gate Arrays (FPGAs), or a programmable logic device, which is known or will be developed in the future to perform given operations.

At least some of the devices (for example, modules or functions) or methods (for example, operations) according to other embodiments of the present inventive concept may be executed by a command stored in a computer-readable storage media (for example, memory) to the form of a program module. If the command is executed by a processor, the function corresponding to the command may be performed by the processor. For example, the computer readable media may include a hard disc, a floppy disc, a magnetic tape, an optical recording medium (such as Compact Disc Read Only Memory (CD-ROM)), a Digital Versatile Disc (DVD), a magneto-optical medium (such as a floptical disc), an internal memory, and the like. The command may include a code generated by a compiler or executable by an interpreter.

Each of the parts (for example, modules or program modules) according to the embodiments of the present inventive concept is constituted of a singular or plural unit, and some of the above-mentioned sub parts may be omitted or other sub parts may be added. Generally or additionally, some of parts (for example, modules or program modules) are integrated as one unit and perform the functions executed by the respective parts before integration in the same as or similar thereto. The operations that are carried out by the modules, program modules, or other parts according to the embodiments of the present inventive concept are performed sequentially, in parallel, repeatedly, or heuristically, or at least some of the operations are performed in a different order, omitted, or added with other operations.

What is claimed is:

1. A deposition device comprising:
   a chamber;
   a mask assembly located inside the chamber and having a mask region made of a metal material and having micro patterns and a frame region formed around the mask region;
   a seating plate located inside the chamber and having a first surface on which a wafer is seated and a second surface opposite to the first surface, at least a portion of the wafer being disposed to face the mask assembly;
   a magnet structure located on the second surface of the seating plate inside the chamber and having a magnet and a magnet holder for accommodating at least a portion of the magnet;
   a first driving module for moving the magnet structure and the seating plate together in a first direction;
   a second driving module for moving the magnet structure in the first direction; and
   a control module for controlling the first driving module and/or the second driving module to adjust a distance between the magnet and the mask region.

2. The deposition device according to claim 1, wherein the magnet comprises a plurality of sub magnets, and the neighboring sub magnets are arranged to have surface contacts with one another.

3. The deposition device according to claim 2, wherein the sub magnets form one surface facing the wafer, and on one surface facing the wafer, an N pole area and an S pole area are alternately arranged repeatedly.

4. The deposition device according to claim 1, wherein the mask region comprises a first region on which the micro patterns are formed and a second region formed around the first region, the magnet is provided to entirely cover the first region of the mask assembly, and when the mask region is viewed on top, the edges of the magnet are spaced apart from the edges of the first region by a distance of at least 10 mm or more.

5. The deposition device according to claim 4, wherein when the mask region is viewed on top, the edges of the magnet are overlaid on top of the second region, and the edges of the magnet are spaced apart from the edges of the frame region by a distance of at least 20 mm or more.

6. The deposition device according to claim 1, wherein the mask region has a thickness in the range of 5 to 15 μm, the wafer has a thickness in the range of 0.5 to 2.0 T, and the magnet is spaced apart from the mask region by a given distance to have a magnetic field in the range of 500 to 2500 G, which is measured on the surface of the wafer.

7. The deposition device according to claim 1, wherein the first driving module comprises a first rod moving in the first direction and a first guide member coupled to the first rod, the magnet structure, and the seating plate, the second driving module is coupled to the first rod and the magnet structure, and the control module operates the first driving module to allow the wafer and the mask region to come into close contact with each other and the second driving module to adjust the distance between the magnet structure and the wafer.

8. The deposition device according to claim 7, further comprising a third driving module for moving the wafer, the third driving module comprising second connection members extending to pass through the first guide member and the seating plate and to thus come into contact with the underside of the wafer.

9. The deposition device according to claim 8, wherein the mask holder comprises protruding portions from both sides thereof, respectively, each protruding portion having a first guide hole formed thereon to insert at least a portion of each second connection member.

10. A deposition system comprising:
a deposition device having a chamber, a seating plate located inside the chamber to seat a wafer, a magnet coupled to the underside of the seating plate, and a mask assembly located inside the chamber to allow at least a portion thereof to face the wafer; and
a transfer device having a load lock chamber for accommodating the wafer, an arm member for transferring the wafer from the load lock chamber to the seating plate, and a fourth driving module for moving the arm member,
wherein the deposition device comprises a first driving module for moving the magnet and the seating plate, a second driving module coupled to the first driving module to move the magnet, a third driving module for moving the wafer, and a control module for controlling the first driving module, the second driving module, the third driving module, and the fourth driving module, the control module being configured to perform a wafer loading process before a deposition process and a wafer unloading process after the deposition process.

11. The deposition system according to claim 10, wherein the control module in the wafer loading process is configured to perform the steps of:
moving the arm member and the wafer onto the seating plate through the fourth driving module;
moving the wafer in a first direction through the third driving module to allow the wafer to be separated from the arm member;
moving the arm member to the load lock chamber through the fourth driving module;
moving the wafer in a second direction opposite to the first direction through the third driving module to allow the wafer to be seated on the seating plate; and
allowing the wafer to come into contact with a mask region of the mask assembly through the first driving module and the second driving module to form a magnetic field with a given range on the deposition surface of the wafer.

12. The deposition system according to claim 11, wherein the control module in the step of allowing the wafer to come into contact with the mask region is configured to perform the steps of:
moving the magnet, the wafer, and the seating plate in the first direction through the first driving module until the wafer comes into contact with the mask region; and
moving the magnet in the first direction through the second driving module to allow the distance between the magnet and the mask region to have a given value.

13. The deposition system according to claim 12, wherein the arm member moves in third directions vertical to the first direction and the second direction, respectively, through the fourth driving module.

14. The deposition system according to claim 12, wherein the wafer is located between the magnet and the mask region when viewed in the first direction.

15. The deposition system according to claim 12, wherein the first driving module comprises a first rod moving in the first or second direction, and the second driving module is coupled to the first rod so that when the first driving module operates, the second driving module moves in the first or second direction, together with the magnet, the seating plate, and the wafer.

16. The deposition system according to claim 12, wherein the third driving module comprises connection members passing through the seating plate to come into contact with the underside of the wafer, and the connection members move in the first or second direction to change the position of the wafer when the third driving module operates.

17. The deposition system according to claim 12, wherein the magnet comprises a plurality of sub magnets, and the neighboring sub magnets are arranged to have surface contacts with one another.

18. The deposition system according to claim 11, wherein the control module in the wafer unloading process is configured to perform the steps of:
moving the magnet in the second direction through the second driving module after the deposition process;
moving the magnet, the wafer, and the seating plate in the second direction through the first driving module to allow the wafer to be separated from the mask region of the mask assembly;
moving the wafer in the first direction through the third driving module to allow the wafer to be separated from the seating plate;

moving the arm member to the space between the wafer and the seating plate inside the chamber through the fourth driving module;

moving the wafer in the second direction through the third driving module to allow the wafer to be seated on the arm member; and moving the arm member and the wafer seated on the arm member to the load lock chamber of the transfer device through the fourth driving module.

19. The deposition system according to claim 10, further comprising a door open and closed to allow the fluid in the load lock chamber of the transfer device and the fluid in the chamber of the deposition device to communicate with each other or to be blocked from each other, and the chamber has a relatively higher vacuum level than the load lock chamber.

* * * * *